(12) United States Patent
Blaichman et al.

(10) Patent No.: US 11,481,624 B2
(45) Date of Patent: Oct. 25, 2022

(54) REINFORCEMENT LEARNING PULSE PROGRAMMING

(71) Applicant: SAMSUNG ELECTRONICS CO., LTD., Suwon-si (KR)

(72) Inventors: Evgeny Blaichman, Tel Aviv (IL); Amit Berman, Ramat-Gan (IL); Elisha Halperin, Maale Adumim (IL); Dan Elbaz, Tirat Carmel (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 536 days.

(21) Appl. No.: 16/593,529

(22) Filed: Oct. 4, 2019

(65) Prior Publication Data

US 2021/0103806 A1  Apr. 8, 2021

(51) Int. Cl.
| | | |
|---|---|---|
| *G11C 16/04* | (2006.01) | |
| *G06N 3/08* | (2006.01) | |
| *G11C 16/10* | (2006.01) | |
| *G06N 3/04* | (2006.01) | |
| *G11C 16/08* | (2006.01) | |

(52) U.S. Cl.
CPC .......... *G06N 3/08* (2013.01); *G06N 3/04* (2013.01); *G11C 16/0483* (2013.01); *G11C 16/08* (2013.01); *G11C 16/10* (2013.01)

(58) Field of Classification Search
CPC ..... G11C 16/0483; G11C 16/08; G11C 16/10; G11C 8/08; G11C 16/26
USPC ......................................................... 365/201
See application file for complete search history.

(56) References Cited

U.S. PATENT DOCUMENTS

| | | | | |
|---|---|---|---|---|
| 9,530,461 | B2* | 12/2016 | Akers ................. | G06F 3/0655 |
| 10,564,864 | B1* | 2/2020 | Ha ...................... | G06F 3/0617 |
| 11,074,004 | B2* | 7/2021 | Casmira ............. | G06F 3/0653 |

OTHER PUBLICATIONS

Andrew G. Barto, et al. "Recent Advances in Hierarchical Reinforcement Learning," Discrete Event Dynamic Systems: Theory and Applications, 13, 41-77, 2003.

* cited by examiner

*Primary Examiner* — Tha-O H Bui
(74) *Attorney, Agent, or Firm* — F. Chau & Associates, LLC

(57) ABSTRACT

A NAND memory device that includes a plurality of blocks, each block comprises a plurality of wordlines and an associated agent, and each wordline comprises a plurality of cells and a plurality of voltage levels and an associated agent, and each voltage level comprises an agent. A method of programming the NAND memory device includes receiving, by an agent at a given rank in the plurality of ranks, parameters from a higher rank agent in the hierarchy of ranks and a state from the memory device; determining, by the agent, an action from the parameters and the state; passing the action as parameters to a lower rank agent in the hierarchy of ranks; and updating the agent based on a reward output by the agent, wherein the reward measures a difference between the target voltage levels of the cells and the actual voltage levels programmed to the cells.

19 Claims, 8 Drawing Sheets

FIG. 2A: Bin Ranges and Bin Reward Table

| Bin Index | Bin Start [mVolts] | Bin End [mVolts] | Bin Center [mVolts] | Bin Range [mVolts] | Bin Reward |
|---|---|---|---|---|---|
| 1 | -10430 | -5310 | -7870 | 5120 | 0.0006 |
| 2 | -5310 | -2750 | -4030 | 2560 | 0.0012 |
| 3 | -2750 | -1470 | -2110 | 1280 | 0.0024 |
| 4 | -1470 | -830 | -1150 | 640 | 0.0043 |
| 5 | -830 | -510 | -670 | 320 | 0.0075 |
| 6 | -510 | -350 | -430 | 160 | 0.0116 |
| 7 | -350 | -270 | -310 | 80 | 0.0161 |
| 8 | -270 | -230 | -250 | 40 | 0.0200 |
| 9 | -230 | -210 | -220 | 20 | 0.0227 |
| 10 | -210 | -200 | -205 | 10 | 0.0244 |
| 11 | -200 | -190 | -195 | 10 | 0.0256 |
| 12 | -190 | -180 | -185 | 10 | 0.0270 |
| 13 | -180 | -170 | -175 | 10 | 0.0286 |
| 14 | -170 | -160 | -165 | 10 | 0.0303 |
| 15 | -160 | -150 | -155 | 10 | 0.0323 |
| 16 | -150 | -140 | -145 | 10 | 0.0345 |
| 17 | -140 | -130 | -135 | 10 | 0.0370 |
| 18 | -130 | -120 | -125 | 10 | 0.0400 |
| 19 | -120 | -110 | -115 | 10 | 0.0435 |
| 20 | -110 | -100 | -105 | 10 | 0.0476 |
| 21 | -100 | -90 | -95 | 10 | 0.0526 |
| 22 | -90 | -80 | -85 | 10 | 0.0588 |
| 23 | -80 | -70 | -75 | 10 | 0.0667 |
| 24 | -70 | -60 | -65 | 10 | 0.0769 |
| 25 | -60 | -50 | -55 | 10 | 0.0909 |
| 26 | -50 | -40 | -45 | 10 | 0.1111 |
| 27 | -40 | -30 | -35 | 10 | 0.1429 |
| 28 | -30 | -20 | -25 | 10 | 0.2000 |
| 29 | -20 | -10 | -15 | 10 | 0.3333 |
| 30 | -10 | 0 | -5 | 10 | 1.0000 |

FIG. 2B: Bin Ranges and Bin Reward Table

| Bin Index | Bin Start(mVolts) | Bin Ending(mVolts) | Bin Center(mVolts) | Bin Range(mVolts) | Bin Reward |
|---|---|---|---|---|---|
| 31 | 0 | 10 | 5 | 10 | 1.0000 |
| 32 | 10 | 20 | 15 | 10 | 0.3333 |
| 33 | 20 | 30 | 25 | 10 | 0.2000 |
| 34 | 30 | 40 | 35 | 10 | 0.1429 |
| 35 | 40 | 50 | 45 | 10 | 0.1111 |
| 36 | 50 | 60 | 55 | 10 | 0.0909 |
| 37 | 60 | 70 | 65 | 10 | 0.0769 |
| 38 | 70 | 80 | 75 | 10 | 0.0667 |
| 39 | 80 | 90 | 85 | 10 | 0.0588 |
| 40 | 90 | 100 | 95 | 10 | 0.0526 |
| 41 | 100 | 110 | 105 | 10 | 0.0476 |
| 42 | 110 | 120 | 115 | 10 | 0.0435 |
| 43 | 120 | 130 | 125 | 10 | 0.0400 |
| 44 | 130 | 140 | 135 | 10 | 0.0370 |
| 45 | 140 | 150 | 145 | 10 | 0.0345 |
| 46 | 150 | 160 | 155 | 10 | 0.0323 |
| 47 | 160 | 170 | 165 | 10 | 0.0303 |
| 48 | 170 | 180 | 175 | 10 | 0.0286 |
| 49 | 180 | 190 | 185 | 10 | 0.0270 |
| 50 | 190 | 200 | 195 | 10 | 0.0256 |
| 51 | 200 | 210 | 205 | 10 | 0.0244 |
| 52 | 210 | 230 | 220 | 20 | 0.0227 |
| 53 | 230 | 270 | 250 | 40 | 0.0200 |
| 54 | 270 | 350 | 310 | 80 | 0.0161 |
| 55 | 350 | 510 | 430 | 160 | 0.0116 |
| 56 | 510 | 830 | 670 | 320 | 0.0075 |
| 57 | 830 | 1470 | 1150 | 640 | 0.0043 |
| 58 | 1470 | 2750 | 2110 | 1280 | 0.0024 |
| 59 | 2750 | 5310 | 4030 | 2560 | 0.0012 |
| 60 | 5310 | 10430 | 7870 | 5120 | 0.0006 |

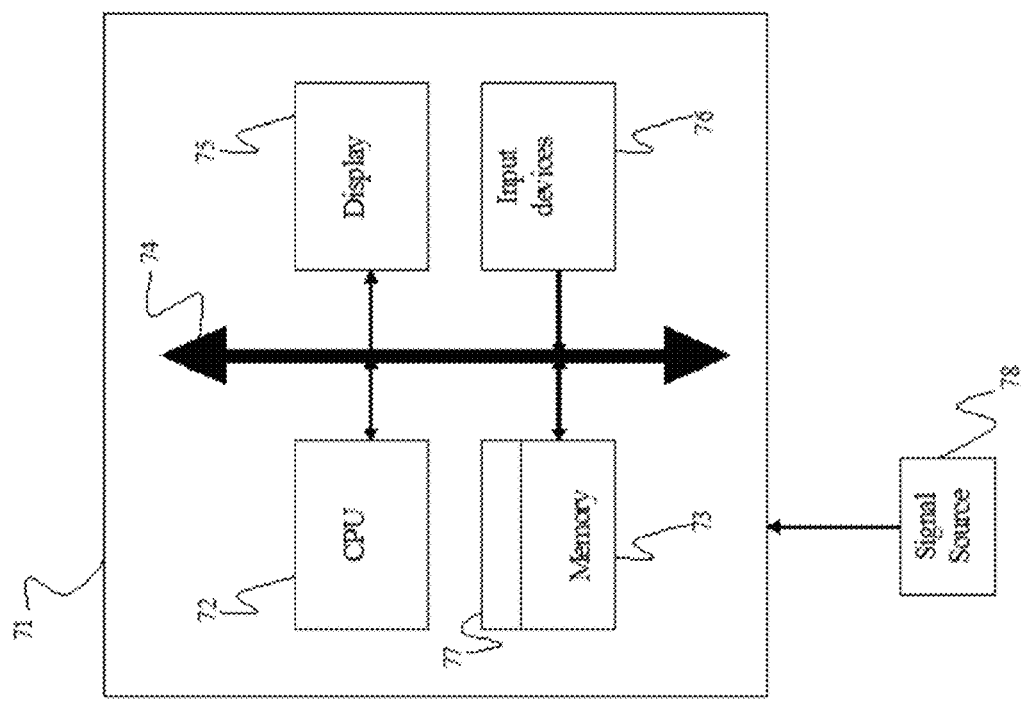

REINFORCEMENT LEARNING PULSE PROGRAMMING

TECHNICAL FIELD

Embodiments of the present disclosure are directed to an AI module that leans an optimal program method for a specific NAND memory device in terms of maximal capacity, minimal program noise, and maximal program speed.

DISCUSSION OF THE RELATED ART

To provide a combination of price and performance for a wide range of high-density storage applications, modern NAND flash memory chips enables storing several bits of data in each flash cell. This scheme is called a multi-level cell. A multi-level cell partitions the threshold voltage range of a flash cell into several voltage states and the written value is extracted from the cell voltage level. However, storing more bits per cell decreases the dynamic voltage range of each voltage state making it more susceptible to noise. As a result thereof, the reliability of flash memory decreases significantly and the performance of current programming algorithms is not sufficient.

During the process of programming a target voltage to a memory cell, the signal is subject to various distortions, noise conditions and other impairments. For example:
  The inhibit vector does not fully assure that the cell voltage remains as before;
  Cell voltage increment is affected by:
    current voltage level;
    inter cell interference affected by the neighboring cells voltage level; and
    inter word lines coupling.

Due to the above, programming a NAND flash is a noisy process: actions do not always go as planned and the writing outcome is not deterministic. As a result, programming algorithm performance is severely degraded. The role of a programming algorithm is to write with maximal level of reliability, overcoming those impairments. Since cell voltage levels at each cell cannot be precisely predicted after applying the programming pulse, there cannot be a plan for the entire sequence of pulses. A policy is needed that maps optimal actions to each of the cells voltage states.

SUMMARY

Exemplary embodiments of the present disclosure are directed to a programming method based on reinforcement learning in which a software agent that operates or controls the voltage writing in the memory cells learns to act and optimize its performance by interacting with the NAND flash environment. The interaction with the environment is done by applying programming actions to the NAND flash and receiving feedback in the form of observations related to the cell voltage states in the NAND flash and rewards related to the programming quality. To increase the learning speed, an optimal programming method is learned using advanced AI techniques such as hierarchical reinforcement learning (HRL). Using hierarchical learning exploits the NAND flash hierarchical structure, i.e. block, word line and level ranks. By breaking the task to those building blocks or ranks, a group of smaller subtasks can be integrated and HRL solution methods are used.

Methods according to embodiments of the disclosure apply a reinforcement learning framework to learn an optimal programming policy for each NAND flash, thus giving the optimal action in each state, rather than making a programming plan ahead. Methods according to embodiments can utilize the hierarchical structure of the NAND flash to reduce the problem complexity, and can utilize function approximations, such as a deep neural network (DNN), to generalize across actions and states. A programming method according to an embodiment yields high performance in an environment with inter cell programming disturbances and other NAND flash channel noise, and can out-perform the established methods in both programming quality, low bit-error-rate (BER), and programming speed.

According to an embodiment of the disclosure, there is provided a method of programming a NAND memory device, where the NAND memory device comprises a plurality of blocks, each block comprises a plurality of wordlines and an associated agent, and each wordline comprises a plurality of cells and a plurality of voltage levels and an associated agent, and each voltage level comprises an agent. The method includes the steps of receiving, by a block agent, data from a user and a block state from the memory device, and determining a block action from the user data and block state, receiving, by a wordline agent, the block action from the block agent and a wordline state from the memory device, and determining a wordline action from the block action and the wordline state, receiving, by a level agent, the wordline action from the wordline agent and a level state from the memory chip, and programming, by the level agent, cells in the wordline determined from the wordline action and the level state to target voltage levels determined from the wordline action and the level state.

According to a further embodiment of the disclosure, the method includes updating the level agent based on a reward output by the level agent, where the reward measures a difference between the target voltage levels of the cells in the wordline and the actual voltage levels programmed to the cells, updating the wordline agent based on a reward output by the wordline agent, where the reward measures a difference between the target voltage levels of the wordline and the actual voltage levels programmed to the wordline, and updating the block agent based on a reward output by the block agent, where the reward measures a difference between the target voltage levels of all wordlines in the block and the actual voltage levels programmed to all wordlines in the block. Updating an agent comprises updating weights of the agent's neural network using a gradient descent algorithm using $\nabla_\Theta J(\Theta) = E_{\pi_\Theta}[\nabla_\Theta \log \pi_\Theta(s, a) A_w(s, a)]$, where $\Theta$ represents the neural network weights, J is an accumulated reward defined as the expectation of a gradient with respect to $\Theta$ of the log of distributions defined by means $\mu$ and standard deviations $\sigma$ output by the agent, times an advantage function, which is a function of the agent's reward.

According to another embodiment of the disclosure, there is provided a method of programming a NAND memory device, where the NAND memory device comprises a plurality of blocks, each block comprises a plurality of wordlines and an associated agent, and each wordline comprises a plurality of cells and a plurality of voltage levels and an associated agent, and each voltage level comprises an agent, the plurality of blocks being a highest rank in a plurality of ranks, the plurality of wordlines being a middle rank in the plurality of ranks, and the plurality of levels being a lowest rank in the plurality of ranks. The method includes the steps of receiving, by an agent at a given rank in the plurality of ranks, parameters from a higher rank agent in the hierarchy of ranks and a state from the memory device, where an agent at the highest rank in the hierarchy of ranks receives its parameters from a user, determining, by the agent, an action from the parameters and the state, passing the action as parameters to a lower rank agent in the hierarchy of ranks, where an agent at the lowest rank in the hierarchy of ranks programs cells in the memory device to target voltage levels determined from the parameters and the state, and updating the agent based on a reward output by the agent. The reward measures a difference between the target voltage levels of the cells and the actual voltage levels programmed to the cells.

According to a further embodiment of the disclosure, a block agent receives data from a user and a block state from the memory device, determines a block action from the user data and block state, and passes the block action as parameters to a wordline agent. A block reward measures a difference between target voltage levels of all wordlines in the block and actual voltage levels programmed to all wordlines in the block.

According to a further embodiment of the disclosure, the block state is a vector ($L_i$, $H_i$) for each wordline i in the block, where $L_i$ is a lowest programmed level in the wordline i, and $H_i$ is a highest level not yet programmed in the wordline i, and the block action is set of triples ($WL_k$, $\mu_i$, $\mu_j$) where $WL_k$ is a wordline to be programmed and $\mu_i$, $\mu_j$ is a range of permitted levels to program.

According to a further embodiment of the disclosure, the block agent outputs a set of means $\mu$ and standard deviations $\sigma$ for minimum and maximum voltage levels to be programmed for each wordline $WL_k$, forms Gaussian distributions for the minimum and maximum voltage levels from the means $\mu$ and standard deviations $\sigma$ for the minimum and maximum voltage levels, and randomly samples Gaussian distributions for the minimum and maximum voltage levels to determine the block agent action.

According to a further embodiment of the disclosure, a reward of the block agent is $R=\Sigma_{wordlines}\Sigma_{L\in levels}\Sigma_{C\in L}|v_L-v_C|/|wordlines|$, where the sums are over all wordlines in the block, all voltage levels in each wordline, and over all cells of each voltage level L, $v_L$ is the target voltage per cell, $v_C$ is an actual voltage programmed to the cell, and |wordlines| is the number of wordlines. Updating the block agent comprises updating weights of the block agent neural network using a gradient descent algorithm using $\nabla_\Theta J(\Theta)=E_{\pi\Theta}[\nabla_\Theta \log \pi_\Theta(s, a)A_w(s, a)]$, where $\Theta$ represents the NN weights, J is an accumulated reward defined as the expectation of a gradient with respect to $\Theta$ of the log of the distributions defined by the means $\mu$ and standard deviations $\sigma$ output by the block agent, times an advantage function, which is a function of the reward.

According to a further embodiment of the disclosure, a wordline agent receives as its parameters a block action from a block agent and a wordline state from the memory device, determines a wordline action from the block action and the wordline state, and passes the wordline action as parameters to a level agent, and a wordline reward measures a difference between the target voltage levels of the wordline and the actual voltage levels programmed to the wordline.

According to a further embodiment of the disclosure, the parameters of the wordline agent a set of triples ($WL_k$, $\mu_i$, $\mu_j$), where $WL_k$ is the wordline to be programmed and $\mu_i$, $\mu_j$ is a range of permitted levels to program. The wordline state is a vector ($\mu_k$, $\sigma_k$) for each level in the wordline WL where $\mu_k$ is the mean for level k and $\sigma_k$ is the variance of level k on the current wordline, and the wordline action is a set of triples ($L_i$, M, C) where $L_i$ is an identifier that specifies the level to program, M is the maximal number of level agent actions to perform, and C is the target voltage for the cells.

According to a further embodiment of the disclosure, the wordline agent calculates a mean $\mu$ and standard deviation $\sigma$ of the voltage levels and a mean $\mu$ and standard deviation $\sigma$ of the number of pulses, and a level decision bit vector whose length is equal to a number of available voltage levels and which has a bit that corresponds to the target voltage level set to a different value from other bits in the vector, forms a Gaussian distribution from the mean $\mu$ and standard deviation $\sigma$ for the number of pulse voltages, and a Gaussian distribution from the mean $\mu$ and standard deviation $\sigma$ for the voltage levels, randomly samples each Gaussian distribution to determine the target voltage level to program to the cells in the wordline, and a maximum number of voltage pulses to use in programming the target voltage levels to the cells, and outputs an index of the bit in the level decision bit vector that corresponds to the target voltage level, a chosen voltage level to program and a number of pulses to program that chosen voltage level.

According to a further embodiment of the disclosure, the target voltage level sampled from the voltage level Gaussian distribution is drawn from a range of voltages about the target voltage level According to a further embodiment of the disclosure, a reward of the wordline agent is $R=\Sigma_{L\in levels}\Sigma_{C\in L}|v_L-v_C|/|wordline|$, where the sums are over all voltage levels and over the cells of voltage level L, $v_L$ is the target voltage per cell, $v_C$ is an actual voltage programmed to the cell, and |wordline| is the number of levels. Updating the wordline agent comprises updating weights of the wordline agent neural network using a gradient descent algorithm using $\nabla_\Theta J(\Theta)=E_{\pi\Theta}[\nabla_\Theta \log \pi_\Theta(s, a)A_w(s, a)]$, where $\Theta$ represents the NN weights, J is an accumulated reward defined as the expectation of a gradient with respect to $\Theta$ of the log of the distributions defined by the means $\mu$ and standard deviations $\sigma$ output by the wordline agent, times an advantage function, which is a function of the reward.

According to a further embodiment of the disclosure, a level agent receives as its parameters a wordline action from a wordline agent and a level state from the memory chip, programs cells in the wordline determined from the wordline action and the level state to target voltage levels determined from the wordline action and the level state. A level reward measures a difference between the target voltage levels of the cells in the wordline and the actual voltage levels programmed to the cells.

According to a further embodiment of the disclosure, the parameters of the level agent is are set of triples ($L_i$, M, C) where $L_i$ is an identifier that specifies the level to program, M is the maximal number of level agent actions to perform, and C is the target voltage for the cells. The level state is a voltage vector for cells in the level from the memory chip, an output of the level agent is a pulse voltage level to be used to program the cells, a threshold voltage level, and a bit vector of those cells in the wordline to be programmed, and the level action applies a number of pulses at the pulse voltage level to those cells specified by the bit vector to be programmed, where the number of pulses is less than than M.

According to a further embodiment of the disclosure, the level agent calculates a mean $\mu$ and standard deviation $\sigma$ for possible pulse voltage levels, forms a Gaussian distribution from the mean $\mu$ and standard deviation $\sigma$ for possible pulse voltage levels, randomly samples the Gaussian distribution to determine an actual pulse voltage level used to program the cells in the wordline, determines a threshold voltage level where cells with a voltage level below the threshold voltage level are programmed and cells with a voltage level equal to or greater than the threshold voltage level are not programmed, and outputs the bit vector that specifies the cells to be programmed.

According to a further embodiment of the disclosure, a reward of the level agent is $R=\Sigma_{C \in L} |v_L - v_C|/|cells|$, where the sum is over the cells of voltage level L, $v_L$ is the target voltage per cell, $v_C$ is an actual voltage programmed to the cell, and |cells| is the number of cells. Updating the level agent comprises updating weights of the level agent neural network using a gradient descent algorithm using $\nabla_\Theta J(\Theta) = E_{\pi\theta}[\nabla_\Theta \log \pi_\theta(s, a) A_w(s, a)]$, where $\theta$ represents the NN weights, J is an accumulated reward defined as the expectation of a gradient with respect to $\Theta$ of the log of the distributions defined by the means $\mu$ and standard deviations $\sigma$ output by the level agent, times an advantage function, which is a function of the reward.

According to another embodiment of the disclosure, there is provided a system for programming a NAND memory device, where the NAND memory device comprises at least one block, the at least one block comprises a plurality of wordlines, and each wordline comprises a plurality of cells and a plurality of voltage levels. The NAND memory device programming system includes at least one block agent, a plurality of wordline agents, one for each wordline in the at least one block, and a plurality of level agents, one for each voltage level in each wordline in the at least one block. The at least one block agent programs the entire block by reading the state of its associated block from the memory device and successively calling each wordline agent to perform writing to specific wordlines in the block, each of the plurality of wordline agents programs a wordline by reading the state of its associated wordline from the memory device and successively calling each level agent to program individual voltage levels on each wordline by using programming pulses on the memory device, and each level agent programs a voltage level to a group of cells by reading the states of its associated cells from the memory device and successively programming each voltage level to selected cells in the wordline. Each level agent returns control back to the calling wordline agent with acknowledgment after finishing programming the levels, each wordline agent returns control back to the calling block agent with acknowledgment after finishing programming the wordline, and the NAND memory device programming system terminates after all wordlines in the block have been written.

According to a further embodiment of the disclosure, the block agent, the plurality of wordline agents, and the plurality of level agents each read the memory device to obtain a reward for their previous action.

According to a further embodiment of the disclosure, each agent is an actor-critic neural network that is trained by a gradient descent algorithm using the agent's reward returned by the memory device. Training an agent comprises updating weights of the agent's neural network using a gradient descent algorithm using $\nabla_\Theta J(\Theta)=E_{\pi\theta}[\nabla_\Theta \log \pi_\theta(s, a) A_w(s, a)]$, where $\theta$ represents the neural network weights, J is an accumulated reward defined as the expectation of a gradient with respect to $\Theta$ of the log of distributions defined by means $\mu$ and standard deviations $\sigma$ output by each agent, times an advantage function, which is a function of the reward for each agent.

BRIEF DESCRIPTION OF THE DRAWINGS

FIGS. 2A-2B is a table of voltage levels quantized into bins to decrease computational demands, according to embodiments of the disclosure.

FIG. 7 is a block diagram of a system that implements a method for training an agent to program different voltage levels to different cells, according to an embodiment of the disclosure.

DETAILED DESCRIPTION OF EXEMPLARY EMBODIMENTS

Figure 1:
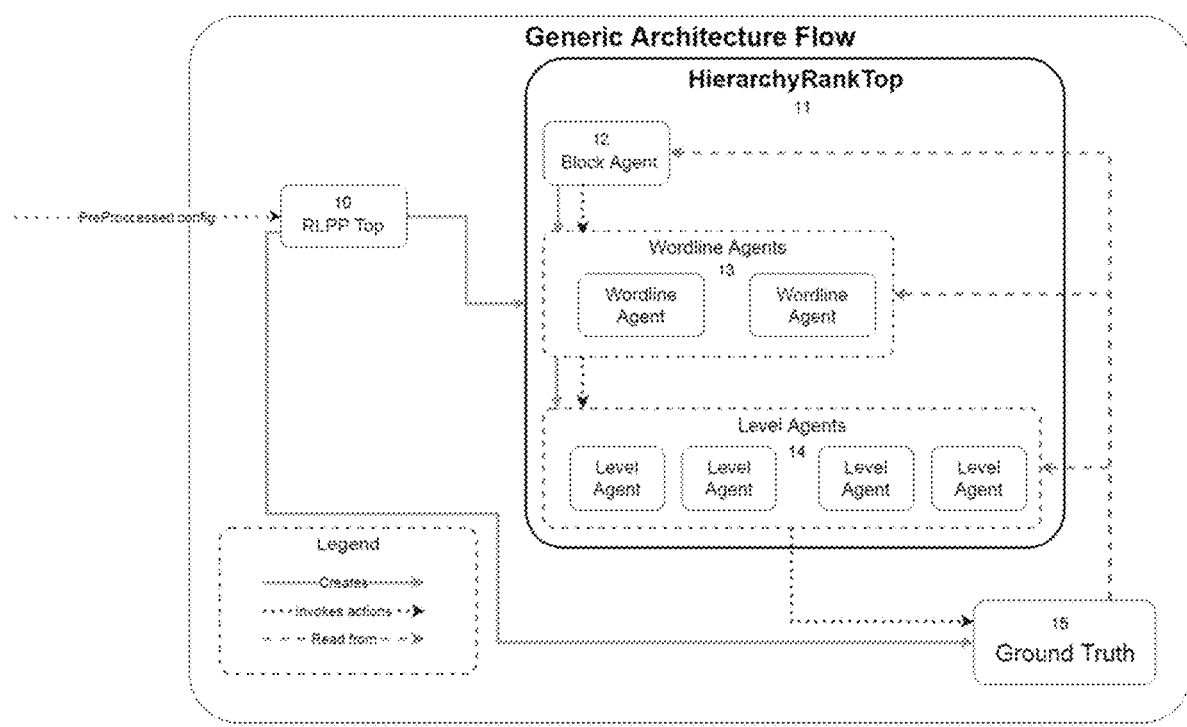
FIG. 1 illustrates hierarchical reinforcement learning, according to embodiments of the disclosure.

Exemplary embodiments of the disclosure as described herein generally provide systems and methods for training an agent to program different voltage levels to different cells. While embodiments are susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure.

NAND flash memories have a three-level hierarchy of block, wordline, and cell. The number of blocks varies between chip types but is usually in the order of several thousand per chip. A flash memory device can then consist of one or more such chips, so overall the amount of blocks per flash memory device varies quite a bit. The number of wordlines per block varies as well. Different chip types can have 64, 128 or 256 wordlines, and this may change in the future. A cell is a physical part of the wordline, i.e. a wordline is basically a long string of cells.

A level is a conceptual entity, in that each cell is programmed to have a certain voltage level and then cells are grouped according to their voltage levels into N groups, in which case there are N level in the wordline. The cell voltage determines which level it belongs to, and accordingly what information it encodes. Every cell at the same level has the same information stored in it. The number of levels per wordline varies, according to the writing scheme. The number of levels is 2 to the power of the number of bits per cell that are written. For example, for 3 bits per cell, there would be 8 levels per wordline, but this may also vary, even in the same block, according to how many bits per cell are written on in a specific wordline.

Hierarchical reinforcement learning (HRL) is a framework for combining learning on different scales. According to embodiments of the disclosure, there are three different agents acting on three different scales, block, wordline and cell scales, all combined under the HRL framework. A single action of a higher level agent is an entire episode of a lower level agent, i.e. the action of the higher level agent defines the parameters under which the lower level agent executes a series of lower level actions, which together comprise its episode. However, each agent in the hierarchy has its own decision model to allow the agent to choose it's actions. These models are policy networks. An exemplary policy network is an actor-critic model.

The inhibit vector marks all the cells that need to be programmed with zeros and those that should not be programmed with ones. The inhibit vector can be very large (around 147K cells) so it is impossible for a policy network to output it as a decision, i.e. individually decide for each cell in the vector whether it should be one or zero. So instead, embodiments of the disclosure use a different solution. Methods according to embodiments output a voltage threshold, and place ones in the inhibit vector for all cells whose voltage exceeds the chosen threshold. The remaining cells are left as zeros. This way, a network according to an embodiment only has to output one number, instead of 147K numbers, aside from its power output, which is also a single number, and which is separate from the inhibit vector.

Embodiments of the disclosure seek to train an agent to program different voltage levels to different cells. However, since the state-action space is too large for brute-force reinforcement learning, embodiments of the disclosure exploit the hierarchical structure of a NAND flash and decompose the task into several subtasks on different levels. This way a group of smaller subtasks can be integrated and learning becomes feasible. The hierarchical structure stems from prior knowledge of the NAND flash structure and is depicted in FIG. 1, which illustrates the flow of a hierarchical reinforcement learning algorithm according to an embodiment during execution.

A method according to an embodiment uses agents to perform actions on different scales. Structurally, the agents are quite similar. Agents according to embodiments are actor-critic type reinforcement learning algorithms, with the actor and critic being neural networks. The agents all have input from the higher level agent, except the block level agent which is the highest level, which defines their working parameters, as well as input from the chip, called here a state, which the agents use to decide their next action and reward for previous actions taken, received through the lower level agent's return values. The agents all output an action to a lower level agent, except the level agent which acts directly on the chip, calculate a reward and return to the calling higher level agent after they are done.

Referring to the FIG. 1, RLPP Top 10 instantiates all common parts, such as connections to the chip, logging, etc., and may be omitted. HierarchyRankTop 11 controls the overall run of hierarchical reinforcement learning algorithm according to an embodiment, and again, may be omitted. The block agent's 12 action is to define the parameters under which the wordline agents 13 run. The block agent 12 programs the entire block by successively calling wordline agents 13 to perform writing to specific wordlines in the block. The wordline agent 13 programs a wordline by using level agents 14 to program individual levels by using programming pulses on the chip. All three agents read the ground truth 15, i.e., the chip, to decide on their next action as well as get rewards for their previous actions, which is how they learn, and after finishing, return control back to the calling agent with acknowledgment, as indicated by the reading line between agents.

As depicted in FIG. 1, there are several ranks in this hierarchy, and each rank has a different state-action space and different goals:

1. Level rank agent: Efficiently write each voltage level of the word-line, minimizing the distance to the target level. After the voltage level has been written, control passes to the wordline agent.

2. Word-line rank agent: Determines which voltage levels to program for a given wordline, and directs the lower rank agent to program those levels, while minimizing interference between different levels on the same word-line. The number of possible levels is $2^n$, where n is the number of bits per cell. After the whole wordline has been written control passes to the block agent.

3. Block rank agent: Determines which wordline in a block to program, while minimizing interference between word-lines on the same block. After all wordlines have been written, the NAND programming terminates.

According to embodiments, although an exact mathematical model of the VNAND flash programming is not assumed, VNAND flash programming can be generally formulated as a Markov Decision Process (MDP). In particular, each rank in the VNAND hierarchy can be formulated as a MDP, i.e., for each rank in the hierarchy an MDP can be defined as described below.

Communication Between Hierarchy Ranks

As mentioned above, the hierarchical structure stems from prior knowledge on the NAND flash structure. From this hierarchical structure, the communication between the different building blocks can be derived. FIG. 1 illustrates communication between the hierarchy building blocks, according to embodiments of the disclosure.

NAND Programming

According to an embodiment, programming a NAND device can be described by the following process.

1. Each cell in a wordline WL has a voltage $v_{cell}$, and $\overline{v_{cell}}$ is a vector of all voltages in WL.
  1.1. After an erase operation, $\overline{v_{cell}} = \overline{v_{start}}$.
  1.2. Each cell has a target voltage $v_{target}$, and $\overline{v_{target}}$ is a vector of all target voltages in WL.
  1.3. The vector $\overline{v_{cell}}$ is also referred to as the WL state.
2. There is a program agent, which can apply a series of pulses to WL that change the state $\overline{v_{cell}}$.
3. The agent's goal is to change the $\overline{v_{cell}}$ to be as close to $\overline{v_{target}}$ as possible.
4. After each pulse, $\overline{v_{cell,new}} = \overline{v_{cell,old}} + \Delta \overline{v_{cell}}$.
5. $\Delta \overline{v_{cell}}$ depends on the pulse parameters selected by the agent: (1) pulse power; and (2) inhibit vector.
6. A pulse with selected parameters is referred to as an action.

The new WL state depends only on the old WL state and that last action taken. This type of process is known as a Markov Decision Process (MDP). An MDP models decision making in situations where outcomes are partly random and partly under the control of a decision maker.

Markov Decision Processes

An MDP is defined by:

1. A set of states $s \in S$, where a state is the information used to determine what happens next.
2. A set of actions $a \in A$.
3. A transition function $T(s,a,s')=P(s'|s,a)$, which is the probability that action a acting on state s leads to state s'.
4. A reward function $R(s,a,s')$, which is a scalar feedback signal that indicates how well the agent is doing at state s. The agent's job is to maximize the cumulative reward.
5. A start state.
6. A terminal state (optional).
7. The Markov condition: given the present state, the future and past are independent:

$$P(S_{t+1}=S' | S_t=s_t, A_t=a_t, S_{t-1}=s_{t-1}, A_{t-1}, \ldots, S_0=s_0) = P(S_{t+1}=S' | S_t=s_t, A_t=a_t).$$

The task of an MDP is to find a policy for the decision maker, which is a function that specifies the action $\pi(s)$ that the decision maker will choose when in state. Once a Markov decision process is combined with a policy in this way, this fixes the action for each state and the resulting combination behaves like a Markov chain, since the action chosen in state is completely determined by π(s), and $\Pr(s_{t+1}=s' | s_t=s, a_t=a)$ reduces to $s_{t+1}=s' | s_t=s$, a Markov transition matrix. The goal is to choose a policy that will maximize a cumulative sum of the reward function: $\Sigma_{t=0}^{\infty} R(s_t, a_t, s_{t+1})$.

NAND Programming as an MDP

NAND programming is a very complex MDP. The cell voltage increment $\Delta \overline{v_{cell}}$ is affected by:
  Current voltage level;
  Pulse power;
  Inter cell interference;
  Inhibited cells disturbed;
  Inter WLs coupling; and
  Retention.

The writing outcome is stochastic, and observations (reads) are also noisy. According to an embodiment, programming policy plays a key element in write performance.

Reinforcement Learning (RL)

Reinforcement learning (RL) is an area of machine teaming concerned with how agents ought to take actions in an environment (MDP) so as to maximize some cumulative reward. RL does not assume knowledge of an exact mathematical model of the MDP and target large MDPs where exact methods become infeasible.

An RL algorithm according to an embodiment of the disclosure includes the following aspects.

Policy:

A policy π gives an action for each state: π*:S→A.

An optimal policy is one that maximizes an expected utility, if followed, e.g., a minimum mean square error (MSE), etc.

Value Function:

A value function is the prediction of a future reward, and is used to evaluate the goodness/badness of a state and policy:

$$V_\pi(s)=E_\pi[R_{t+1}+\gamma R_{t+2}+\gamma^2 R_{t+3}+ \ldots | S_t=s], \gamma \in [0,1].$$

Utility of Q(s,a):

Q*(s,a)=the expected utility when starting out having taken action a from state s and acting optimally thereafter Bellman Equation:

The Bellman equations characterize optimal values:

$$V^*(s)=\max_a \Sigma_{s'} T(s,a,s')[R(s,a,s')+\gamma V^*(s')].$$

Values can be computed by iteration:

$$V_{k+1}(s) \leftarrow \max_a \Sigma_{s'} T(s,a,s')[R(s,a,s')+\gamma V_k(s')].$$

Evaluation:

For a fixed current policy π, find the value function by policy evaluation. Iterate until values converge:

$$V_{k+1}^{\pi_i}(s)=\Sigma_{s'} T(s,\pi_i(s),s')[R(s,\pi_i(s),s')+\gamma V_{k+1}^{\pi_i}(s')].$$

Policy Extraction:

For fixed values, a better policy can be obtained using policy extraction using a one-step look-ahead:

$$\pi_{i+1}(s)=\arg\max_a \Sigma_{s'} T(s,a,s')[R(s,a,s')+\gamma V^{\pi_i}(s')].$$

On-Policy Learning:

An on-policy learner learns the value of the policy being carried out by the agent, including the exploration steps. An exemplary on-policy learning algorithm is the SARSA (State-action-reward-state-action) algorithm.

Off-Policy Learning:

An off-policy learner learns the value of the optimal policy independently of the agent's actions. An exemplary off-policy learning algorithm is the Q-learning algorithm.

Figure 4:
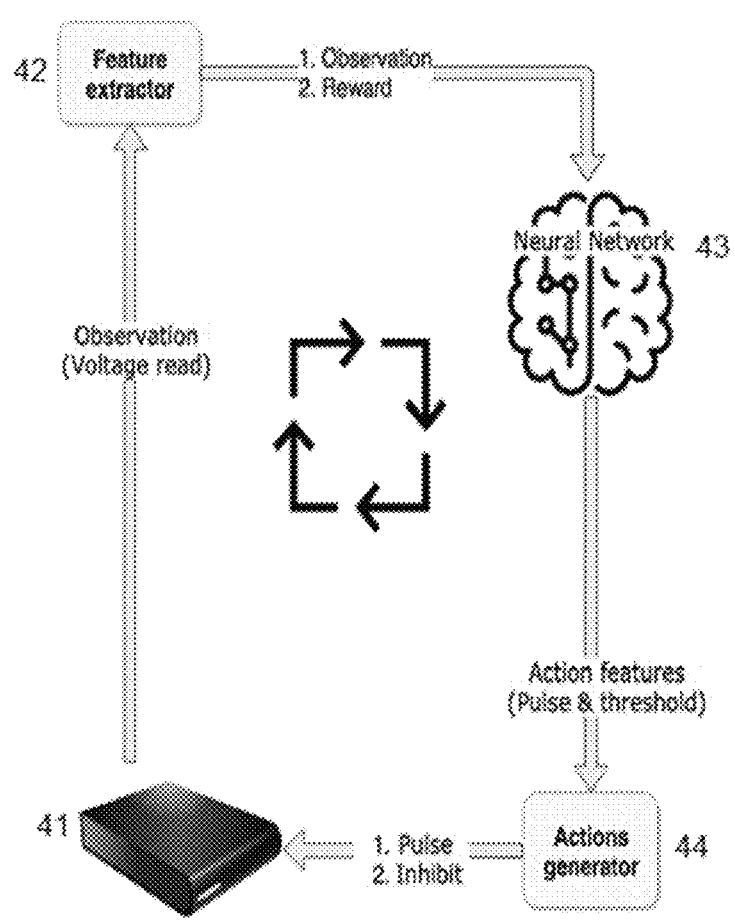
FIG. 4 illustrates the work flow of reinforcement learning, according to an embodiment of the disclosure.

FIG. 4 illustrates an overview of the work flow of reinforcement learning. An observation is received from the chip 41 and is turned into features and rewards for the agent by a feature extractor 42, i.e. input for the neural network 43, which then outputs its decision, which is then translated by an actions generator 44 into an action that the chip 41 can perform, i.e. a pulse voltage, inhibit vector, etc. Then the state of the chip reread and so on until the agent decides it is done, i.e. that the action should be to terminate, and then the agent passes control back to a higher rank agent. Higher rank hierarchies act similarly from this high level point of view, except their action is simply passed as parameters to a lower rank agent.

Hierarchical RL—Introduction:

The state-action space for RL of wordlines is extremely large. For example, a typical wordline has 16 KBs of cells, each cell has a voltage range from −3000:10:5000 mV, equivalent to 800 values, and there are 128 WLs per block. This yields a total state space of $800 \times 16 \times 8 \times 1000 \times 128 \approx 1.3 \times 10^{10}$ states. Brute force RL learning is too slow to handle this many states. Deep RL can address this situation by approximating the value function with a neural network (NN).

Hierarchical reinforcement learning (h-RL) is a sub-area of RL that splits the agent into sub-agent hierarchies. h-RL is a technology that solves problems that could not be solved by traditional RL algorithms.

1. h-RL learning is much faster than RL learning: it enables learning each hierarchy independently. Each hierarchy's state/action space is relatively small in comparison to the WL state-space.
2. h-RL learning uses a priori knowledge of the designer of the teaming algorithm.
3. h-RL learning uses needs less storage than RL learning.
4. h-RL learning gains from the high reusability of trained sub-agents.

For h-RL theory please refer to: "Recent advances in Hierarchical Reinforcement learning", Barto, 2003, https://people.cs.umass.edu/~mahadeva/papers/hrl.pdf, the contents of which are herein incorporated by reference in their entirety.

According to embodiments, hierarchical reinforcement learning enables the task of approximating the value function to decoupled into a three level hierarchy, with single level programming as the low level, wordline programming as the intermediate level, and block programming at the highest level. Each level relatively independent of the others, and each can be modeled as an MDP and learned in parallel. The task can be simplified or made more complex, by using more or less complex loss functions.

Figure 3:
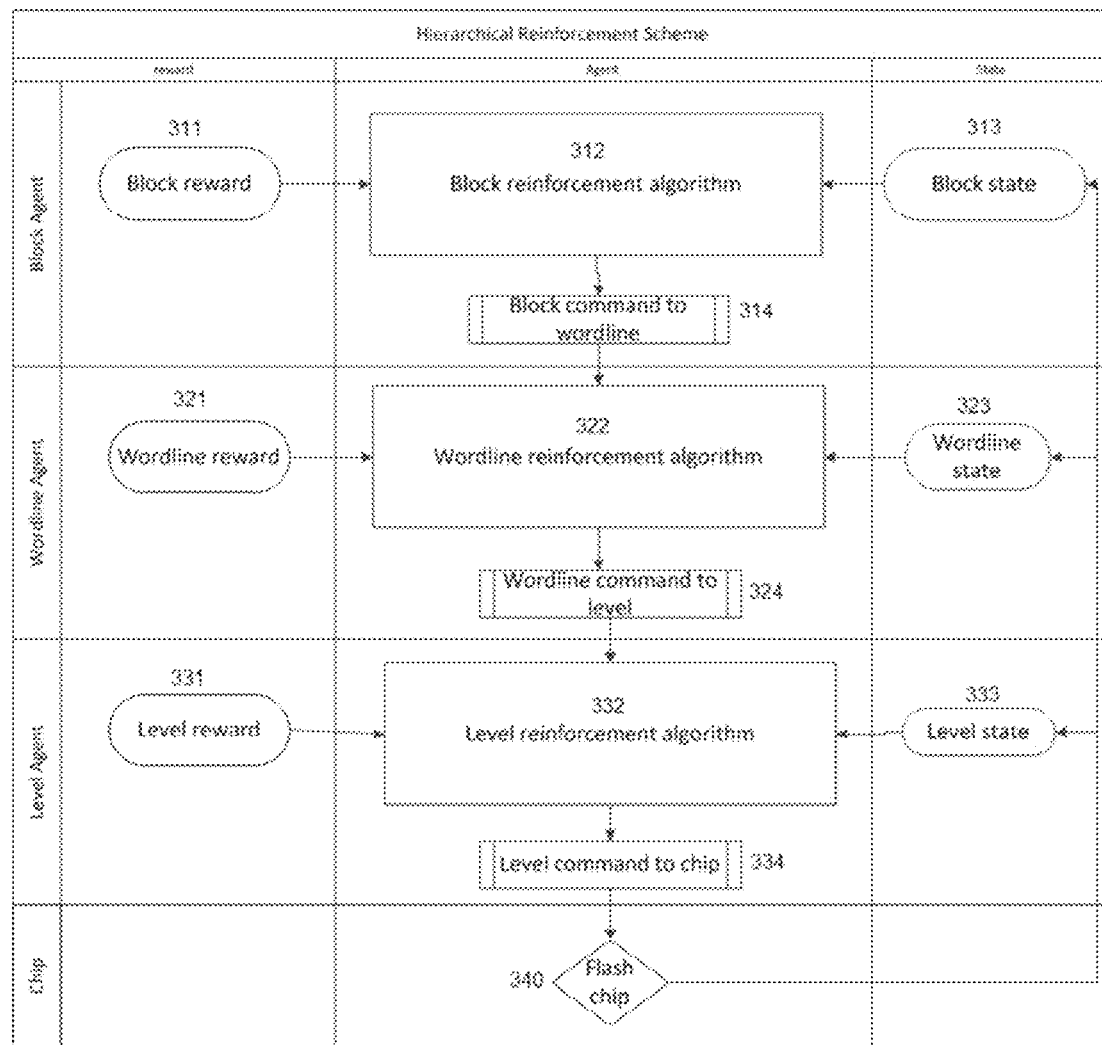
FIG. 3 illustrates a basic hierarchical reinforcement learning scheme, according to an embodiment of the disclosure.

FIG. 3 illustrates a basic hierarchical reinforcement learning scheme, according to an embodiment of the disclosure. Referring to the figure, a method according to an embodiment starts with the block agent, which programs the entire block. The block agent is the "Block reinforcement algorithm" 312 and gets a "Block state" 313 input from the chip, and decides on an action, such as which wordline in the block to currently program. This action translates into a set of parameters that are passed as "Block command" 314 to the wordline agent, under which the wordline agent begins to operate. The wordline agent is the "Wordline reinforcement algorithm" 322 which receives the command 314 and gets a "Wordline state" 323 from the chip and decides on an action of its own, and passes it as the "Wordline command" 324 down to the level agent. The level agent is the "Level reinforcement algorithm" 332 and receives the command 324 and gets a 'Level state' 333 from the chip, and decides on its action. This action translates into a Level command 334 to a flash chip 340. It then programs the chip 340 according to its action until done, and then returns control to the wordline agent indicating that the level agent's action are complete. After the wordline agent is done as well, it returns control to the block agent, indicating that the wordline agent's action are complete. The block algorithm, wordline algorithm and level algorithm parameter rewards 311, 321, and 331, respectively, in the leftmost column are only relevant during agent training. Then, in addition to executing its decisions, each training agent also uses the rewards to update itself and improve.

According to embodiments, a reinforcement learning model can be based on existing algorithms or on human expertise. A reinforcement learning model according to an embodiment can learn from the existing algorithm or expert by imitation. The reinforcement learning model can then be improved on the wordline level, and after finding a basic stable policy, the reinforcement learning model can then be adapted to program a block.

Project Description

Exemplary embodiments of the disclosure provide an AI module referred to herein as reinforcement learning pulse programming (RLPP) that learns an optimal programming method for a specific NAND memory device in terms of its maximal capacity, minimal program noise, and maximal program speed. Exemplary embodiments of the disclosure can also provide an RLPP that can enable a 6-bit technology of future NAND memory devices.

The agents at each level are neural networks (NNs) and a can be trained separately. Training is performed once, typically by the manufacturer of the NAND device after the device is manufactured, and the trained programs are subsequently invoked each time a user writes data to the NAND device. The agents can be trained simultaneously, but this training is slow. According to an embodiment, the level agents are trained first, followed by the wordline agents, followed by the block agents. However, embodiments are not limited thereto, and the training order can be reversed, using surrogates for the lower level agents.

Actor-Critic Algorithms:

Actor-Critic is the name of a single algorithm that receives a state from the chip and instructions, such as working parameters, from a higher rank in the hierarchy, translates the state and parameters into something it can work with, which can differ for each rank in the hierarchy, passes it through its internal neural network, which again can differ for each rank in the hierarchy, takes the net's output and translates it into an action for the next lower rank in the hierarchy to execute, or an action on the chip at the lowest rank in the hierarchy. The name Actor-Critic comes from the way the neural network outputs two types of output simultaneously, which are considered the "actor" and "critic" but are jointly used to train the network. After training is complete, only the actor part is still relevant to determine the next action. For example, the block agent can receive an instruction to write a block 20. The block agent then reads the state of that block, translates it into input for its neural network, passes it through the net to get the output, takes the output and translates it into an action for the wordline agent, such as programming levels 30-40 on wordline 15, and passes control to the wordline agent. After the wordline agent is done, if network is being trained, the block agent receives a reward from the wordline agent and updates the model. Regardless, it then reassesses the state of the block and decides on its next action, etc., until it decides it is done.

An Actor-Critic agent is a single network with two outputs: an action and a valuation of the current state. An MDP describes the world the agent works in, i.e. the interaction with the chip. MDP basically means that the result of an action depends only on the action taken and the state of the chip at the time of the action. Thus, only the current state of the chip need be considered to decide on an action, i.e. the only input the network needs is the state of the chip.

Level Rank

According to embodiments, a level rank's agent forms a tight distribution around the target voltage. For each action (pulse+inhibit), the result is non deterministic and depends on the voltage levels of the target cells and neighboring cells. Hence, the following sets of states, actions and rewards can be derived naturally.

Set of States: Different actions are required depending on (1) the current voltage level in the programmed cells, and (2) the current voltage level in the neighboring cells. Both of the preceding can be used to represent a state. Voltage levels can be quantized into bins to decrease computational demands, as shown in the table of FIGS. 2A-2B. The preceding representation is an example and can easily be expanded or reduced.

Set of Actions: Programming cells is accomplished by using the following atomic actions:

(1) selecting a cell, which is controlled by the inhibit vector, which is a binary vector that selects the indexes of the cells to which the pulse will be given;

(2) applying the voltage pulse on the selected cells; and (3) stopping the current action and transferring control back to the calling function, i.e., the wordline agent.

Hence, for a level agent, the actions are the preceding actions.

Level Agent

A level agent according to an embodiment controls the strength of the voltage pulses to the chip and the verify level, which is a threshold that determines which cells are to be programmed. Cells whose voltage is above the verify level are not programmed, while cells below the verify level are programmed. The parameters used by the level agent are received from the wordline agent, and is a triple of an identifier of the voltage level to be programmed, the target voltage level for the cells to be programmed, and the number of pulses to be applied to program the cells.

According to an embodiment, a level agent is an Actor-Critic variant of a Policy Neural Network model as described above. The input to the NN can be extracted from data read from the chip, which is a voltage vector for all cells in the wordline that are to be programmed. Given the cells to be programmed, the voltage range is divided into bins, as shown in FIGS. 2A-B, a histogram of the number of cells in each bin is formed, and the number of cells in each bin is determined. The histogram is the input to the NN.

The output of a level agent NN according to an embodiment is a pulse voltage level to be used to program to the cells, a list of those cells to be programmed, and the verify level, as described above. Note that the pulse voltage level differs from the target voltage level for the cells, and is typically much greater than the target voltage level. For example, to program a cell to 5 volts, pulse voltages of 20 volts may be used. These three outputs are used to form the inhibit vector, which has a bit for each cell in the wordline, and where the bit is set to one for those cells to be programmed. In particular, the NN simultaneously outputs a mean $\mu$ and standard deviation $\sigma$ for each pulse voltage, and a mean $\mu$ and standard deviation $\sigma$ for possible verify levels.

These means and standard deviations are the possible actions of the level agent, and are used to define Gaussian distributions. These distributions are then randomly sampled to determine the actual actions of the level agent.

An inhibit vector according to an embodiment is a bit vector whose length corresponds to the number of cells in the wordline, is set by the level agent, and tells the chip which cells to program and which cells not to program. The inhibit vector is determined based on the sampled verify level and the list of target cells to be programmed. The level agent sets the inhibit vector first by the level it needs to program, i.e. other levels in the wordline are immediately added to the inhibit vector, which it gets from the wordline agent. Then it decides which cells to add to the inhibit vector according to how close the cells' voltages are to the intended target voltage, so that they do not overshoot the voltage. For example, if a cell's voltage is already the same as the level it is intended to be, i.e. it is at the target, there is no need to apply more voltage to it, which would likely overshoot the target voltage, so its corresponding bit in the inhibit vector is set to 0.

According to an embodiment, the level agent programs the specified number of pulses to the cells selected by the inhibit vector, and outputs a reward, which is a measure of the programming quality that can be defined as a function of the distance from the desired target voltage. According to an embodiment, a reward is calculated from $R_1 = \Sigma_{C \in L} |v_L - v_C| / |cells|$, $R_2 = \Sigma_{C \in L} |v_L - v_C|^2 / |cells|$, $R = (R_1 + R_2)/2$, and the level-reward=$R_{current} - R_{previous}$, where current reward is what was calculated on this measurement and previous is the saved measurement from the previous action, where the sum is over the cells of voltage level L, $v_L$ is the target voltage per cell, $v_C$ is the actual voltage programmed to the cell, and |cells| is the number of cells.

During training, according to an embodiment, the output of the level agent is used to tune the parameters of the NN, where the NN parameters are the weights of the network. This tuning can be done using a gradient descent optimization, a standard algorithm for tuning NNs. According to an embodiment, a gradient descent method can be implemented by an actor critic method. The gradient can be expressed as $$\nabla_\Theta J(\Theta) = E_{\pi\Theta}[\nabla_\Theta \log \pi_\Theta(s,a) A_w(s,a)],$$

where $\Theta$ represents the NN parameters, and J is an accumulated reward defined as the expectation of the gradient with respect to $\Theta$ of the log of the current NN policy, which is a function of the state and actions, times an advantage function, which is also a function of the state and actions. According to an embodiment, the state is the histogram that was the input to the NN, and the actions are the cells and voltage levels actually programmed to the chip. The current NN policy is the distribution defined by the mean $\mu$ and standard deviation $\sigma$ output by the NN, and the advantage function is typically a function of the reward, such as the current reward—the previous reward.

After the level agent has performed its action, it returns a parameter indicating that control is being passed back to the wordline agent. According to an embodiment, the reward is not passed up to the higher rank agent, in this case the wordline agent.

Word Line Rank

According to an embodiment, a wordline agent is a NN that implements an Actor-Critic algorithm as described above, and makes the levels as evenly distributed as possible.

Set of States: Embodiments of the disclosure represent a wordline using the mean and variance for each level, represented as two input vectors:
(1) $\mu$—a vector of level means on the currently programmed wordline; and
(2) $\sigma$—a vector of level variances on the currently programmed wordline.

Set of Actions: According to embodiments, the set of actions includes four separate decisions. These decisions then define the parameters for a level agent, which the wordline agent uses to execute its lower level tasks, i.e., the wordline agent creates a level agent with the parameters it chooses, lets it run its course and return, and then reevaluates its state and decides on the next action to take:
(1) Level selection—which level to program;
(2) Level cells—a binary vector representing which cells are considered to be in the chosen level;
(3) Allowed number of pulses—the maximal number of programming pulses allowed to the level agent, before the level agent has to terminate and return control to the wordline agent;
(4) Stop current action and transfer control back to the calling function, i.e., the block agent.

Reward: According to an embodiment, the wordline reward is simply $R_{wordline} = (\Sigma_{L \in levels} R_L) / |levels|$, wherein $R_L$ is the reward for level L calculated as above for the level agent case, and |levels| is the number of levels.

The Wordline Agent:

A wordline agent according to an embodiment takes all cells in a wordline, divides the cells into groups based on voltage levels, and reads from the chip a vector of $\mu$ and $\sigma$ for all levels in the wordline. Note that in some embodiments, each voltage level is associated with an index, such as a positive integer. The input to the wordline agent is the vector of s and a for all levels in the wordline, an initial target voltage for each group of cells, and a budget, which is a maximum number of pulses to use to program each level. The parameters for the wordline agent, which are received from the block agent, are the wordline to be programmed, and indices of the minimum and maximum voltages $\mu_\alpha$ and $\mu_\beta$ to be programmed to that wordline.

Specifically, a wordline agent NN according to an embodiment outputs a mean $\mu$ and standard deviation $\sigma$ of the voltage levels and a mean $\mu$ and standard deviation $\sigma$ of the maximum number of pulses, which are used to form Gaussian distributions for the number of pulse voltages and for the voltage levels, and a level decision bit vector whose length is equal to the number of available voltage levels and which has a bit that corresponds to a target voltage level set to a different value from the other bits in the vector. For example, in some embodiments, the bit corresponding to the target voltage level is set to 1 and all other bits are set to 0. In other embodiments, the bit corresponding to the target voltage level is set to 0 and all other bits are set to 1. The Gaussian distributions for the voltage levels and the maximum number or pulses are randomly sampled in the ranges about the respective initial target voltage and budget to determine a target voltage level to program to the cells in the wordline, and a maximum number of voltage pulses to use in programming that target voltage level.

The output is not a range of voltage levels (or targets). It is a single target voltage. Note that the wordline agent receives an initial target voltage for each level as part of its input (mentioned in the previous paragraph) and then samples the aforementioned Gaussian distribution to choose a target voltage from a range around the initial given target The action of the wordline agent are the parameters passed to the level agent. The parameters are a triple that includes the maximum number of pulses to program a cell to the target voltage, as sampled from its corresponding Gaussian distribution, the target voltage or target voltage interval, as sampled from its corresponding Gaussian distribution, and the index of the selected voltage level as read from the level decision vector.

A reward of the wordline agent according to an embodiment is $R_{wordline}=(\Sigma_{L\in levels}R_L)/|levels|$, wherein $R_L$ is the reward for level L calculated as above for the level agent case, and |levels| is the number of levels. The wordline agent NN is updated during training by a gradient descent optimization, similar to the level agent, and a repeated description thereof will be omitted.

The training of the wordline agent can introduce high variance that should be mitigated. According to an embodiment, an actor-critic model is used to help stabilize the wordline agent. In an actor-critic algorithm, the critic evaluates the executed policy and updates it frequently, for a high learning rate, while the actor executes policy $\pi_\theta(s, a)A_w(s, a)$ influenced by the critic and updates slowly.

Block Rank

According to an embodiment, the block rank's agent exploits the close relation of word-lines lying on the same string-select line (SSL). For every word-line in the block, the set of states is the lowest level programmed and the highest level not yet programmed. The set of actions includes selection of the word-line that will be programmed and the range of permitted levels to program. The block reward may be average of the wordline rewards summed over all programmed word-lines.

The Block Agent:

According to an embodiment, a block agent model is an actor-critic NN that can exploit the relation of the wordlines lying on the same SSL and on the same position in their SSLs.

A block agent according to an embodiment takes as its parameters an index of the block to be programmed and the data to program the block with, where data values are >=0 and <=the maximum number of voltage levels. According to one embodiment, the input is a vector of two numbers ($L_i$, $H_i$) for each wordline in the block, where $L_i$ is the lowest programmed level, and $H_i$ is the highest level not yet programmed. For example, if the block has 10 wordlines, then the input will have 10×2=20 numbers.

The output of a block agent according to an embodiment, i.e., the block agent's action, is the wordline $WL_k$ to be programmed and a set of means μ and standard deviations σ for the minimum and maximum voltage levels to be programmed for each wordline $WL_k$, which are used to form Gaussian distributions which are then randomly sampled to determine the actions, the range ($\mu_i$, $\mu_j$) of permitted levels to program. The actions are passed as parameters to the wordline agent. An optional output is the maximum number of pulses allowed.

According to an embodiment, the reward for the block agent is $R_{block}=(\Sigma_{WL\in wordlines}R_{WL})/|wordlines|$, where $R_{WL}$ is the reward for each wordline, and |wordlines| is the number of wordlines.

Hierarchy Overview

Figure 5:
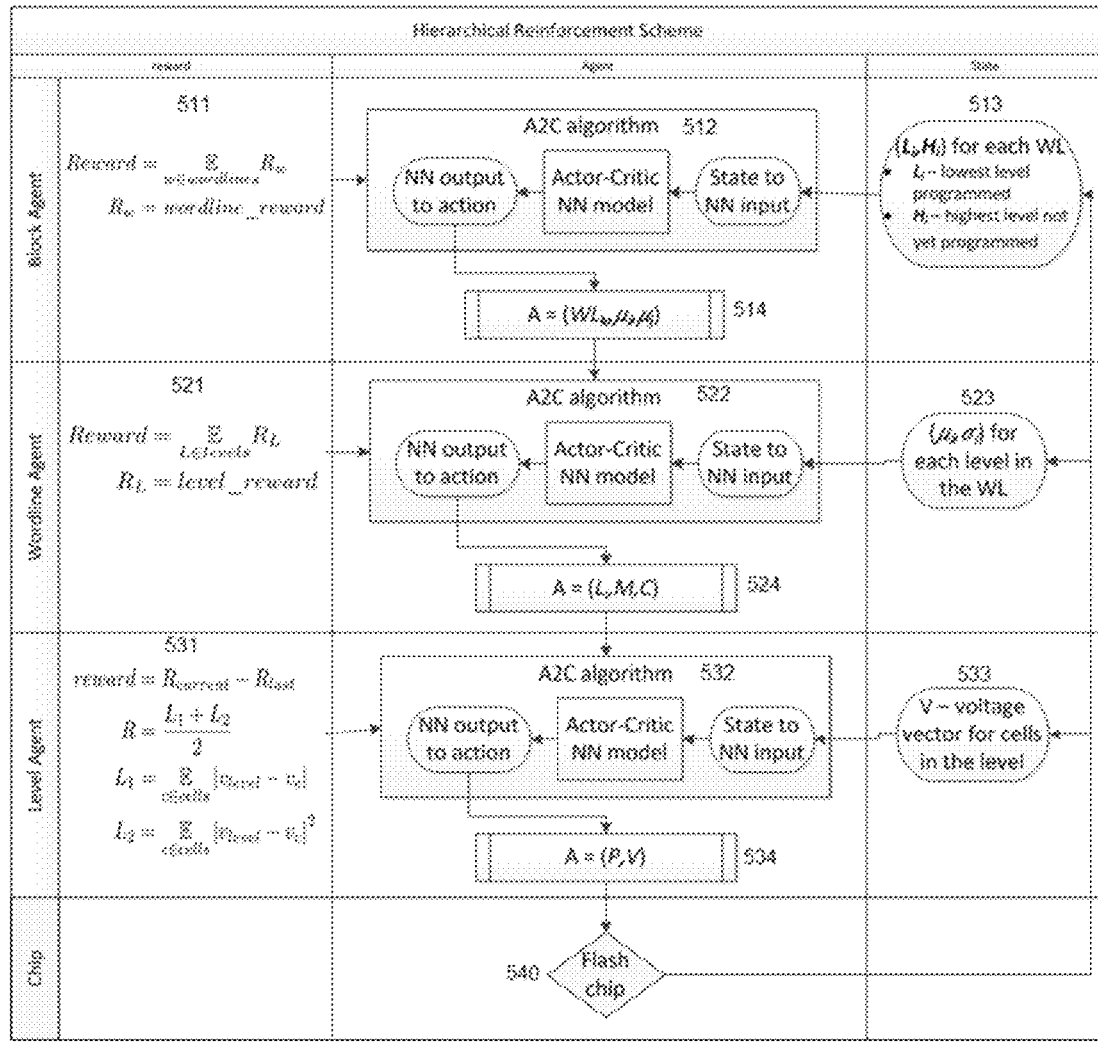
FIG. 5 is an overview of the hierarchies together, according to an embodiment of the disclosure.

FIG. 5 is an overview of the hierarchies together, according to an embodiment of the disclosure. The interactions of the Block agent, the Wordline agent and the Level agent are substantially similar to those shown in FIG. 3. Referring to FIG. 5, each agent is an actor-critic NN that received as its input a state from the chip, and outputs an action to be passed to the next lower level. The block agent 512 obtains a vector 513 ($L_i$, $H_i$) for each wordline in the block, where $L_i$ is the lowest level programmed for wordline i, and $H_i$ is the highest level not yet programmed for wordline i, and passes as its action 514 a set of triples ($WL_k$, $\mu_i$, $\mu_j$) to the wordline agent 522, where WL is the wordline being programmed, and $\mu_i$, $\mu_j$ specify the range of permitted levels to program. The wordline agent 522 obtains from the chip a vector 523 ($\mu_i$, $\sigma_i$) for each level in the wordline $WL_k$, where $\mu_i$ is the mean for level i and $\sigma_i$ is the variance of level i on the current wordline and passes as its action 524 to the level agent 532 a set of triples ($L_i$, M, C), where $L_i$ is the voltage level to program, i.e., all cells whose target voltage is $L_i$, M is the maximal number of programming pulses, i.e. level agent actions, to perform before transferring control back to the wordline agent, and C is the target voltage to which the cells should be programmed (note that $L_i$ just denotes which cells to program, not what voltage they should have). The level agent 532 obtains from the chip a vector 533 of voltages for each cell in the level, and programs the chip 540 according to its action 534 until done. The level agent outputs a reward 531 as described above, and returns control to the wordline agent. The wordline agent outputs a reward 521 as described above and returns control to the block agent. The reward 511 of the block agent is the same except it averages over all cells in all of its wordlines. This basically means that the closer each cell gets to its desired voltage level, the better is the reward.

During a training phase, the reward at each rank is used to change the rank agent's behavior, i.e., how it learns, as expressed by the update formula in the update column:

$$\nabla_\Theta J(\Theta)=E_{\pi\theta}[\nabla_\Theta \log \pi_\theta(s,a)A_w(s,a)].$$

where Θ represents the NN parameters, and J is an accumulated reward defined as the expectation of the gradient with respect to Θ of the log of the current NN policy, which is a function of the state and actions, times an advantage function $A_w(s, a)$, which is also a function of the state and actions, which, measures how good the action was. The formula $\nabla_\Theta J(\Theta)=E_{\pi\theta}[\nabla_\Theta \log \pi_\theta(s, a)A_w(s, a)]$ is used to update s when training the networks, and is an average over the policy being used, i.e. the average of all rewards received for all actions, of the gradient of the policy, i.e. the log of the probabilities of the actions given the state, multiplied by the advantage function which measures the difference between the value predicted for the state and action, and the value actually calculated after the fact. This formula is used update the network after actions are taken and rewards are received for the actions.

Results

Figure 6:
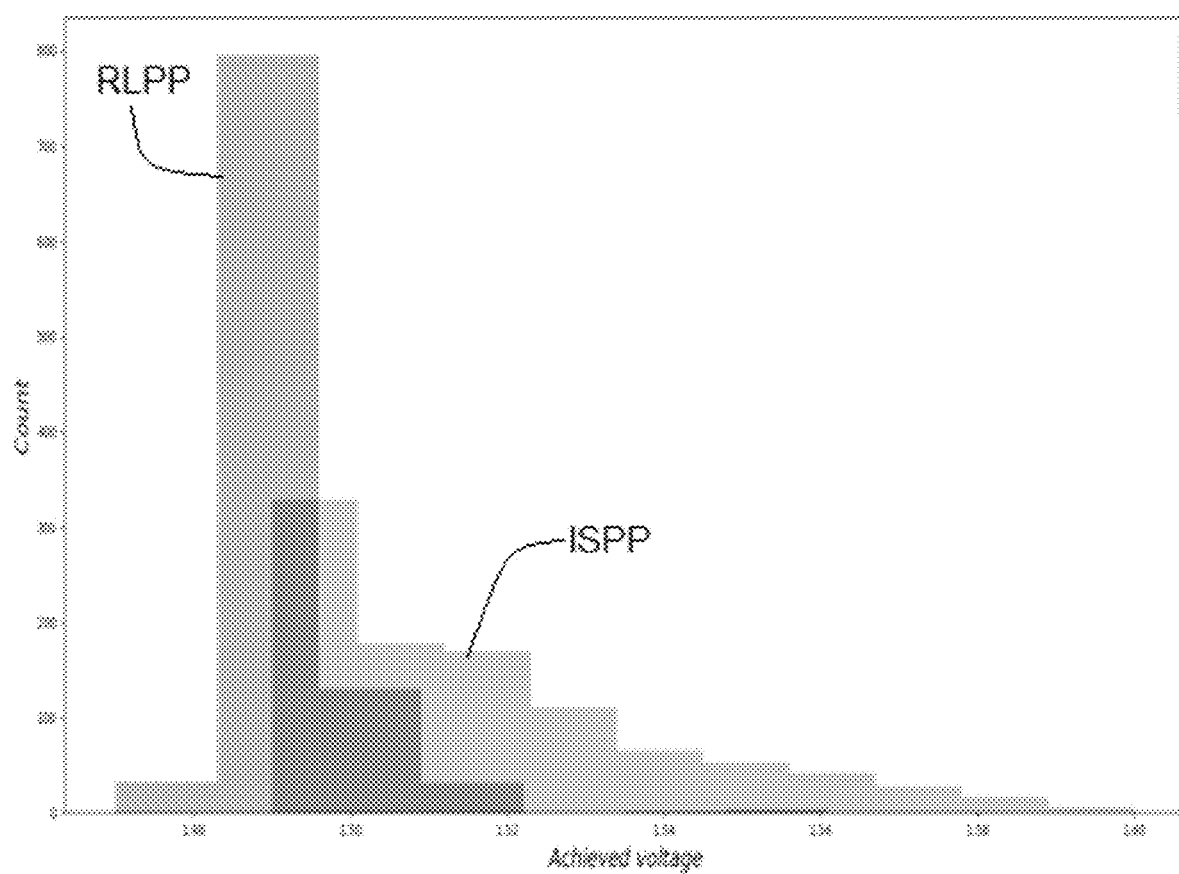
FIG. 6 is a histogram of achieved voltages rates for an ISPP algorithm and a RLPP algorithm according to an embodiment, for a target voltage of 1.5 volts.

An incremental step program pulse (ISPP) algorithm is a standard algorithm for programming a level, i.e. without any kind of machine learning. FIG. 6 shows how well a reinforcement learning program pulse (RLPP) algorithm according to an embodiment behaves compared to an ISPP algorithm, and presents a histogram of achieved voltages rates for an ISPP algorithm and a RLPP algorithm according to an embodiment, for a target voltage of 1.5 volts. The X axis is voltage, measured in volts. Since this is a histogram of cell voltages, the Y axis is how many cells have each voltage level. For the RLPP, the average voltage is 1.49 volts with a σ=0.009, and for the ISPP, the average voltage is 1.52 volts with a σ=0.023. What can be seen is that an RLPP algorithm according to an embodiment centers the cells closer around their intended target voltage, which means there will be fewer errors in reading them afterwards, and that an RLPP algorithm (RLPP) can outperform the ISPP algorithm for a single cell.

System Implementation

It is to be understood that embodiments of the present disclosure can be implemented in various forms of hardware, software, firmware, special purpose processes, or a combination thereof. In some embodiments, the present disclosure can be implemented in the memory controller of a flash memory, but it could migrate to the flash memory chip itself. The state can read from the chip by the controller, which passes the state to an algorithm according to an embodiment. In other embodiments, the present disclosure can be implemented in software as an application program tangible embodied on a computer readable program storage device. The application program can be uploaded to, and executed by, a machine comprising any suitable architecture.

FIG. 7 is a block diagram of a system that implements an RLPP method for NAND memories. Referring now to FIG. 7, a computer system 71 for implementing the present invention can comprise, inter alia, a central processing unit (CPU) 72, a memory 73 and an input/output (I/O) interface 74. The computer system 71 is generally coupled through the I/O interface 74 to a display 75 and various input devices 76 such as a mouse and a keyboard. The support circuits can include circuits such as cache, power supplies, clock circuits, and a communication bus. The memory 73 can include random access memory (RAM), read only memory (ROM), disk drive, tape drive, etc., or a combinations thereof. The present disclosure can be implemented as a routine 77 that is stored in memory 73 and executed by the CPU. As such, the computer system 71 is a general purpose computer system that becomes a specific purpose computer system when executing the routine 77 of the present invention. Alternatively, as described above, embodiments of the present disclosure can be implemented in a memory controller 78 of a flash memory that is in signal communication with computer system 71.

The computer system 71 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. A method of programming a NAND memory device, wherein the NAND memory device comprises a plurality of blocks, each block comprises a plurality of wordlines and an associated agent, and each wordline comprises a plurality of cells and a plurality of voltage levels and an associated agent, and each voltage level comprises an agent, the method comprising the steps of: receiving, by a block agent, data from a user and a block state from the NAND memory device, and determining a block action from the user data and block state; receiving, by a wordline agent, the block action from the block agent and a word line state from the memory device, and determining a wordline action from the block action and the wordline state; receiving, by a level agent, the wordline action from the wordline agent and a level state from the NAND memory device; and programming, by the level agent, cells in the wordline determined from the wordline action and the level state to target voltage levels determined from the wordline action and the level state.

2. The method of claim 1, further comprising:
updating the level agent based on a reward output by the level agent, wherein the reward measures a difference between the target voltage levels of the cells in the wordline and the actual voltage levels programmed to the cells;
updating the wordline agent based on a reward output by the wordline agent, wherein the reward measures a difference between the target voltage levels of the wordline and the actual voltage levels programmed to the wordline; and
updating the block agent based on a reward output by the block agent, wherein the reward measures a difference between the target voltage levels of all wordlines in the block and the actual voltage levels programmed to all wordlines in the block,
wherein updating an agent comprises updating weights of the agent's neural network using a gradient descent algorithm using $\nabla_\Theta J(\Theta) = E_{\pi\Theta}[\nabla_\Theta \log \pi_\Theta(s, a) A_w(s, a)]$,
where $\Theta$ represents the neural network weights, J is an accumulated reward defined as the expectation of a gradient with respect to $\Theta$ of the log of distributions defined by means $\mu$ and standard deviations $\sigma$ output by the agent, times an advantage function, which is a function of the agent's reward.

3. A method of programming a NAND memory device, wherein the NAND memory device comprises a plurality of blocks, each block comprises a plurality of wordlines and an associated agent, and each wordline comprises a plurality of cells and a plurality of voltage levels and an associated agent, and each voltage level comprises an agent, the plurality of blocks being a highest rank in a plurality of ranks, the plurality of wordlines being a middle rank in the plurality of ranks, and the plurality of voltage levels being a lowest rank in the plurality of ranks, the method comprising the steps of: receiving, by an agent at a given rank in the plurality of ranks, parameters from a higher rank agent in the plurality of ranks and a state from the NAND memory device, wherein an agent at the highest rank in the plurality of ranks receives its parameters from a user; determining by the agent, an action from the parameters and the state; passing the action as parameters to a lower rank agent in the plurality of ranks, wherein an agent at the lowest rank in the plurality of ranks programs cells in the NAND memory device to target voltage levels determined from the parameters and the state; and updating the agent based on a reward output by the agent, wherein the reward measures a difference between the target voltage levels of the cells and the actual voltage levels programmed to the cells.

4. The method of claim 3,
wherein a block agent receives data from a user and a block state from the memory device, determines a block action from the user data and block state, and passes the block action as parameters to a wordline agent, and wherein a block reward measures a difference between target voltage levels of all wordlines in the block and actual voltage levels programmed to all wordlines in the block.

5. The method of claim 4, wherein the block state is a vector ($L_i$, $H_i$) for each wordline i in the block, wherein $L_i$ is a lowest programmed level in the wordline i, and $H_i$ is a highest level not yet programmed in the wordline i, and the block action is set of triples ($WL_k$, µi, µj) wherein $WL_k$, is a wordline to, be programmed and µi, µj is a range of permitted levels to program.

6. The method of claim 5, wherein the block agent outputs a set of means µ and standard deviations σ for minimum and maximum voltage levels to be programmed for each wordline $WL_k$, forms Gaussian distributions for the minimum and maximum voltage levels from the means µ and standard deviations σ for the minimum and maximum voltage levels, and randomly samples Gaussian distributions for the minimum and maximum voltage levels to determine the block agent action.

7. The method of claim 6, wherein a reward of the block agent is $R=\Sigma_{wordlines}\Sigma_{L\in levels}\Sigma_{C\in L}|v_L-v_C|/|wordlines|$, where the sums are over all wordlines in the block, all voltage levels in each wordline, and over all cells of each voltage level L, $v_L$, is the target voltage per cell, $v_C$ is an actual voltage programmed to the cell, and |wordlines| is the number of wordlines, wherein updating the block agent comprises updating weights of the block agent neural network using a gradient descent algorithm using $\nabla_\Theta J(\Theta)=E_{\pi\Theta}[\nabla_\Theta \log \pi_\Theta(s, a)A_w(s, a)]$, where Θ represents the NN weights, J is an accumulated reward defined as the expectation of a gradient with respect to Θ of the log of the distributions defined by the means µ and standard deviations σ output by the block agent, times an advantage function, which is a function of the reward.

8. The method of claim 3, wherein a wordline agent receives as its parameters a block action from a block agent and a wordline state from the memory device, determines a wordline action from the block action and the wordline state, and passes the wordline action as parameters to a level agent, and wherein a wordline reward measures a difference between the target voltage levels of the wordline and the actual voltage levels programmed to the wordline.

9. The method of claim 8, wherein the parameters of the wordline agent a set of triples ($WL_k$, µi, µj), wherein $WL_k$, is the wordline to be programmed and µi, µj is a range of permitted levels to program, the wordline: state is a vector (µk, σk) for each level in the wordline WL wherein µk is the mean for level k and σk is the variance of level k on the current wordline, and the wordline action is a set of triples ($L_i$, M, C) wherein $L_i$ is an identifier that specifies the level to program, M is the maximal number of level agent actions to perform, and C is the target voltage for the cells.

10. The method of claim 8, wherein the wordline agent calculates a mean µ and standard deviation σ of the voltage levels and a mean µ and standard deviation σ of the number of pulses, and a level decision hit vector whose length is equal to a number of available voltage levels and which has a bit that corresponds to the target voltage level set to a different value from other bits in the vector, forms a Gaussian distribution from the mean µ and standard deviation a for the number of pulse voltages, and a Gaussian distribution from the mean µ and standard deviation σ for the voltage levels, randomly samples each Gaussian distribution to determine the target voltage level to program to the cells in the wordline, and a maximum number of voltage pulses to use in programming the target voltage levels to the cells, and outputs an index of the bit in the level decision bit vector that corresponds to the target voltage level, a chosen voltage level to program and a number of pulses to program that chosen voltage level.

11. The method of claim 10, wherein the target voltage level sampled from the voltage level Gaussian distribution is drawn from a range of voltages about the target voltage level.

12. The method of claim 10, wherein a reward of the wordline agent is $R=\Sigma_{L\in levels}\Sigma_{C\in L}|v_L-v_C|/|wordline|$, where the sums are over all voltage levels and over the cells of voltage level L, $v_L$ is the target voltage per cell, $v_C$ is an actual voltage programmed to the cell, and |wordline| is the number of levels, wherein updating the wordline agent comprises updating weights of the wordline agent neural network using a gradient descent algorithm using $\nabla_\Theta J(\Theta)=E_{\pi\Theta}[\nabla_\Theta \log \pi_\Theta(s, a)A_w(s, a)]$, where Θ represents the NN weights, J is an accumulated reward defined as the expectation of a gradient with respect to Θ of the log of the distributions defined by the means µ and standard deviations σ output by the wordline agent, times an advantage function, which is a function of the reward.

13. The method of claim 3, wherein a level agent receives as its parameters a wordline action from a wordline agent and a level state from the memory chip, programs cells in the wordline determined from the wordline action and the level state to target voltage levels determined from the wordline action and the level state, and wherein a level reward measures a difference between the target voltage levels of the cells in the wordline and the actual voltage levels programmed to the cells.

14. The method of claim 13, wherein:

the parameters of the level agent is are set of triples ($L_i$, M, C) wherein $L_i$ is an identifier that specifies the level to program, M is the maximal number of level agent actions to perform, and C is the target voltage for the cells;

the level state is a voltage vector for cells in the level from the memory chip;

an output of the level agent is a pulse voltage level to be used to program the cells, a threshold voltage level, and alit vector of those cells in the wordline to be programmed, and the level action applies a number of pulses at the pulse voltage level to those cells specified by the bit vector to be programmed, wherein the number of pulses is less than than M.

15. The method of claim 14, wherein the level agent calculates a mean µ and standard deviation σ for possible pulse voltage levels, forms a Gaussian distribution from the mean µ and standard deviation σ for possible pulse voltage levels, randomly samples the Gaussian distribution to determine an actual pulse voltage level used to program the cells in the wordline, determines a threshold voltage level wherein cells with a voltage level below the threshold voltage level are programmed and cells with a voltage level equal to or greater than the threshold voltage level are not programmed, and outputs the bit vector that specifies the cells to be programmed.

16. The method of claim 15, wherein a reward of the level agent is $R=\Sigma_{C\in L}|v_L-v_C|/|cells|$, where the sum is over the cells of voltage level L, $v_L$ is the target voltage per cell, $v_C$ is an actual voltage programmed to the cell, and |cells| is the number of cells, wherein updating the level agent comprises updating weights of the level agent neural network using a gradient descent algorithm using $\nabla_\Theta J(\Theta)=E_{\pi\theta}[\nabla_\Theta \log \pi_\theta(s, a)A_w(s, a)]$, where $\Theta$ represents the NN weights, J is an accumulated reward defined as the expectation of a gradient with respect to $\Theta$ of the log of the distributions defined by the means $\mu$ and standard deviations $\sigma$ output by the level agent, times an advantage function, which is a function of the reward.

17. A system for programming a NAND memory device, wherein the NAND memory device comprises at least one block, the at least one block comprises a plurality of wordlines, and each wordline comprises a plurality of cells and a plurality of voltage levels, the NAND memory device programming system comprising: at least one block agent; a plurality of wordline agents, one for each wordline in the at least one block; and a plurality of level agents, one for each voltage level in each wordline in the at least one block, wherein the at least one block agent programs the entire block by reading a state of its associated block from the NAND memory device and successively calling each wordline agent to perform writing to specific wordlines in the block, each of the plurality of wordline agents programs a wordline by reading the state of its associated wordline from the NAND memory device and successively calling each level agent to program individual voltage levels on each wordline by using programming pulses on the NAND memory device, wherein each level agent programs a voltage level to a group of cells by reading the states of its associated cells from the NAND memory device and successively programming each voltage level to selected cells in the wordline, and each level agent returns control back to the calling wordline agent with acknowledgment after finishing programming the voltage level, each wordline agent returns control back to the calling block agent with acknowledgment after finishing programming the wordline, and the system for programming the NAND memory device terminates after all wordlines in the block have been written.

18. The system of claim 17, wherein the block agent, the plurality of wordline agents, and the plurality of level agents each read the memory device to obtain a reward for their previous action.

19. The system of claim 18, wherein each agent is an actor-critic neural network that is trained by a gradient descent algorithm using the agent's reward returned by the memory device, wherein training an agent comprises updating weights of the agent's neural network using a gradient descent algorithm using $\nabla_\Theta J(\Theta)=E_{\pi\theta}[\nabla_\Theta \log \pi_\theta(s, a)A_w(s, a)]$, where $\Theta$ represents the neural network weights, J is an accumulated reward defined as the expectation of a gradient with respect to $\Theta$ of the log of distributions defined by means $\mu$ and standard deviations $\sigma$ output by each agent, times an advantage function, which is a function of the reward for each agent.

* * * * *